United States Patent
Lee et al.

(10) Patent No.: US 10,298,944 B2
(45) Date of Patent: May 21, 2019

(54) DECODING CIRCUIT APPLIED TO MULTIMEDIA APPARATUS AND ASSOCIATED DECODING METHOD

(71) Applicant: MStar Semiconductor, Inc., Hsinchu Hsien (TW)

(72) Inventors: Kuan-Chou Lee, Hsinchu County (TW); Kai-Wen Cheng, Hsinchu County (TW); Tai-Lai Tung, Hsinchu County (TW)

(73) Assignee: MSTAR SEMICONDUCTOR, INC., Hsinchu Hsien (TW)

( * ) Notice: Subject to any disclaimer, the term of this patent is extended or adjusted under 35 U.S.C. 154(b) by 0 days.

(21) Appl. No.: 15/841,624

(22) Filed: Dec. 14, 2017

(65) Prior Publication Data
US 2018/0310014 A1  Oct. 25, 2018

(30) Foreign Application Priority Data
Apr. 21, 2017 (TW) .............................. 106113373 A

(51) Int. Cl.

| | |
|---|---|
| H03M 7/00 | (2006.01) |
| H04N 19/44 | (2014.01) |
| H03M 13/00 | (2006.01) |
| H04H 40/90 | (2008.01) |
| H04N 5/455 | (2006.01) |
| H04N 21/40 | (2011.01) |

(52) U.S. Cl.
CPC ........ *H04N 19/44* (2014.11); *H03M 13/6575* (2013.01); *H04H 40/90* (2013.01); *H04N 5/455* (2013.01); *H04N 21/40* (2013.01); *H03M 7/00* (2013.01); *H03M 2201/4275* (2013.01); *H04H 2201/16* (2013.01)

(58) Field of Classification Search
CPC .... H04N 19/44; H04N 5/455; H03M 13/6575
USPC ........................................... 341/99; 375/148
See application file for complete search history.

(56) References Cited

U.S. PATENT DOCUMENTS

| | | | |
|---|---|---|---|
| 2004/0190603 A1 | 9/2004 | Dabak et al. | |
| 2014/0245104 A1* | 8/2014 | Song | H03M 13/17 714/762 |
| 2017/0099173 A1* | 4/2017 | Yun | H04L 27/2608 |
| 2017/0187493 A1* | 6/2017 | Lincoln | H04L 1/0036 |
| 2017/0277887 A1* | 9/2017 | Ijiro | G06F 21/552 |

* cited by examiner

*Primary Examiner* — Lam T Mai
(74) *Attorney, Agent, or Firm* — McClure, Qualey & Rodack, LLP

(57) ABSTRACT

A decoding circuit applied to a multimedia apparatus is provided. The decoding circuit is for decoding encoded data to generate system information, and includes multiple processing circuits and a determination circuit. The multiple processing circuits individually process the encoded data to generate multiple processed signals, and respectively correspond to multiple bit combinations of a part of the system information. The determination circuit determines the system information according to the multiple processed signals.

17 Claims, 9 Drawing Sheets

DECODING CIRCUIT APPLIED TO MULTIMEDIA APPARATUS AND ASSOCIATED DECODING METHOD

This application claims the benefit of Taiwan application Serial No. 106113373, filed Apr. 21, 2017, the subject matter of which is incorporated herein by reference.

BACKGROUND OF THE INVENTION

Field of the Invention

The invention relates in general to a receiving circuit in a multimedia apparatus, and more particularly to a decoding circuit applied to a multimedia apparatus and an associated decoding method.

Description of the Related Art

In a current Digital Video Broadcast-Satellite-Second Generation (DVB-S2), a receiver decodes a physical layer signaling (PLS) code to obtain system information including 7 bits. The system information mainly includes a modulation scheme, a code rate, a forward error correction data length and whether pilot data is present. In a Digital Video Broadcast-Satellite-Second Generation Extension (DVB-S2X) system, apart from a different encoding method, the system information further includes a bit for distinguishing between DVB-S2 and DVB-S2X. Because the receiver has no way of knowing what the 8-bit system information is before decoding received data, the receiver may encounter errors while decoding the PLS code, and correct information can be obtained only after repeated decoding operations. Further, the probability of decoding errors can be further increased when the signal quality is poor, resulting in degraded performance.

SUMMARY OF THE INVENTION

Therefore, it is a primary object of the present invention to provide a decoding circuit applied to a multimedia apparatus and an associated decoding method capable of quickly and accurately decoding a PLS code to obtain system information, so as to solve issues of the prior art.

A decoding circuit applied to a multimedia apparatus is disclosed according to an embodiment of the present invention. The decoding circuit decodes encoded data to generate system information, and includes multiple processing circuits and a determination circuit. The multiple processing circuits individually process the encoded data to generate multiple processed signals, and respectively correspond to multiple bit combinations of a part of the system information. The determination circuit determines the system information according to the multiple processed signals.

A decoding method applied to a multimedia apparatus is disclosed according to an embodiment of the present invention. The decoding method, for decoding encoded data to generate system data, includes steps of: utilizing multiple processing circuits to individually process the encoded data to generate multiple processed signals that respectively correspond to multiple bit combinations of a part of the system information; and determining the system information according to the multiple processed signals.

A decoding circuit applied to a multimedia apparatus is disclosed according to another embodiment of the present invention. The decoding circuit decodes encoded data to generate system data, and includes a processing circuit and a determination circuit. The processing circuit processes the encoded data to generate multiple processed signals that respectively correspond to multiple bit combinations of a part of the system information. The determination circuit is coupled to the processing circuit, and determines that the part of system information corresponds to one of the multiple bit combinations according to the multiple processed signals.

The above and other aspects of the invention will become better understood with regard to the following detailed description of the preferred but non-limiting embodiments. The following description is made with reference to the accompanying drawings.

DETAILED DESCRIPTION OF THE INVENTION

Figure 1:
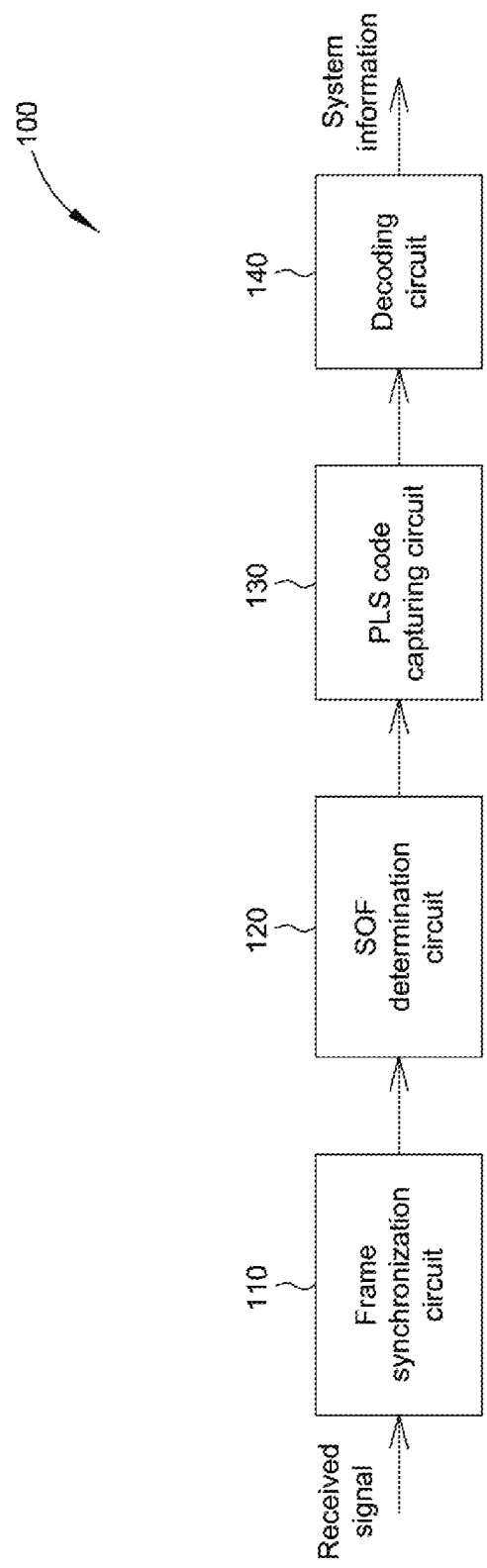
FIG. 1 is a block diagram of a circuit according to an embodiment of the present invention applied to a multimedia apparatus.

FIG. 1 is a block diagram of a circuit 100 according to an embodiment of the present invention applied to a multimedia apparatus. In this embodiment, the circuit 100 may be disposed on a television or a set-top box (STB), and complies with the specifications of a DVB-S2X system. Referring to FIG. 1, the circuit 100 includes a frame synchronization circuit 110, a start of frame (SOF) determination circuit 120, a physical layer signaling (PLS) code capturing circuit 130 and a decoding circuit 140.

Figure 2:
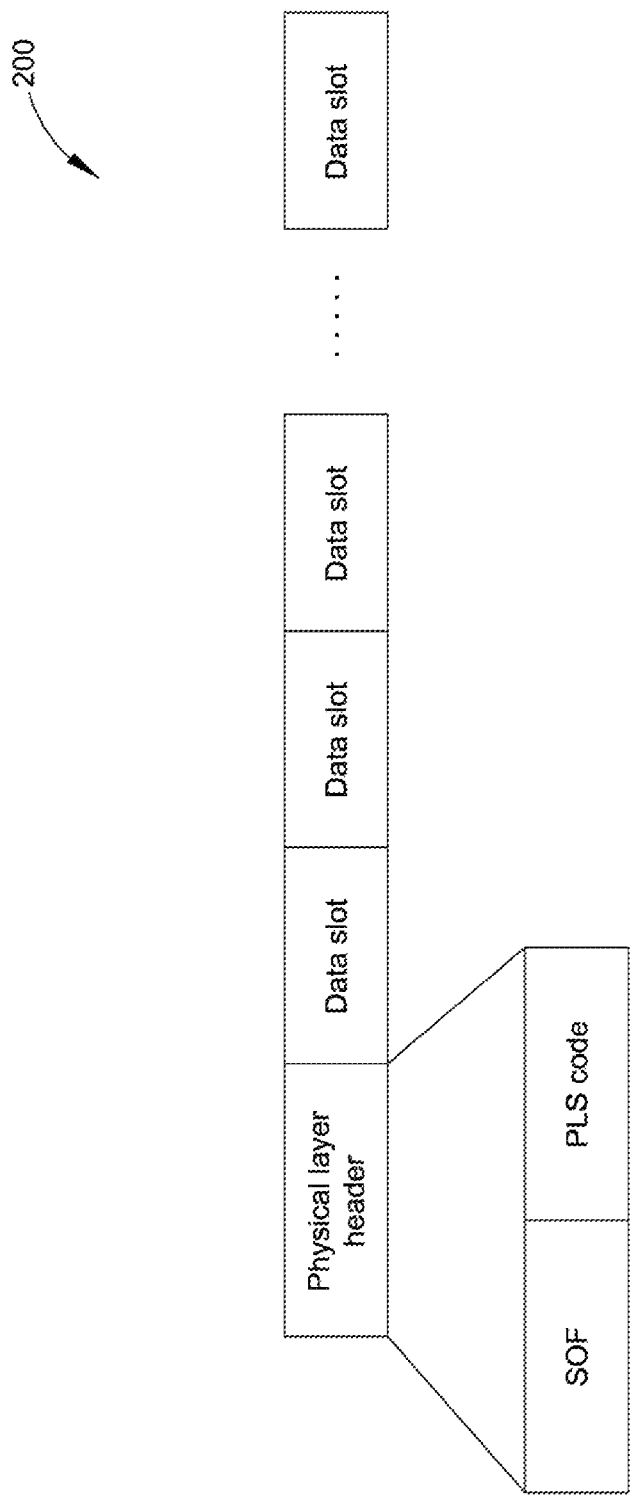
FIG. 2 is a schematic diagram of a signal frame.

In an operation of the circuit 100, the frame synchronization circuit 110 receives, via an antenna, a received signal including multiple signal frames. FIG. 2 shows a schematic diagram of a signal frame 200. The signal frame 200 includes a physical layer header and multiple data slots. These data slots are for storing encoded data, and the physical layer header includes an SOF and a PLS code. The SOF includes information needed for time synchronization. The SOF determination circuit 120 determines the address of the SOF of each frame so as to allow the PLS code capturing circuit 130 to accordingly obtain the PLS code in each frame. The decoding circuit 140 decodes the PLS code to obtain system information.

In a DVB-S2X system, the PLS code is generated through calculation on system information and a generation matrix by a transmitting end. More specifically, the system information is 8-bit data, in which the $1^{st}$ bit b0 indicates that this signal is compliant with a DVB-S2 system or a DVB-S2X system. For example, when the $1^{st}$ bit b0 is "0", it means that the signal is compliant with a DVB-S2 system; when the $1^{st}$ bit is "1", it means that the signal is compliant with a DVB-S2X system. Further, in the 8-bit system information, the 8$^{th}$ bit b7 indicates whether the PLS code includes pilot data.

For example, when the 8$^{th}$ bit b7 is "0", it means that there is no pilot data; when the 8$^{th}$ bit b7 is "1", it means that pilot data is present. In a DVB-S2 system, the generation matrix is a 6*32 matrix, and the transmitting end multiplies 6 bits (b1, . . . , b6) in the system information by the generation matrix to obtain a 1*32 intermediate matrix (i.e., 32-bit data), generates a 1*64 matrix by performing a logic operation on the last bit b7 in the system information and the intermediate matrix, and generates the PLS code after mapping the matrix to a constellation diagram. On the other hand, in a DVB-S2X system, the generation matrix is a 7*32 matrix, and the transmitting end multiples the first 7 bits (b0, b1, . . . , b6) by the generation matrix to obtain a 1*32 intermediate matrix, generates a 1*64 matrix by performing a logic operation on the last bit b7 in the system information and the intermediate matrix, and generates the PLS code after mapping the matrix to a constellation diagram. Calculation details for generating the PLS code are generally known to one person skilled in the art, and shall be omitted herein.

Below is an example of a generation matrix in a DVB-S2 system:

$$\begin{bmatrix} 0101010101 & 0101010101 & 0101010101 & 01 \\ 0011001100 & 1100110011 & 0011001100 & 11 \\ 0000111100 & 0011110000 & 1111000011 & 11 \\ 0000000011 & 1111110000 & 0000111111 & 11 \\ 0000000000 & 0000001111 & 1111111111 & 11 \\ 1111111111 & 1111111111 & 1111111111 & 11 \end{bmatrix}$$

Below is an example of a generation matrix in a DVB-S2X system:

$$\begin{bmatrix} 1001000010 & 1011000010 & 1101110111 & 01 \\ 0101010101 & 0101010101 & 0101010101 & 01 \\ 0011001100 & 1100110011 & 0011001100 & 11 \\ 0000111100 & 0011110000 & 1111000011 & 11 \\ 0000000011 & 1111110000 & 0000111111 & 11 \\ 0000000000 & 0000001111 & 1111111111 & 11 \\ 1111111111 & 1111111111 & 1111111111 & 11 \end{bmatrix}$$

One main feature of the present invention is to accurately and efficiently restoring the received PLS code into system information by using the decoding circuit 140, so as to facilitate subsequent operations.

Figure 3:
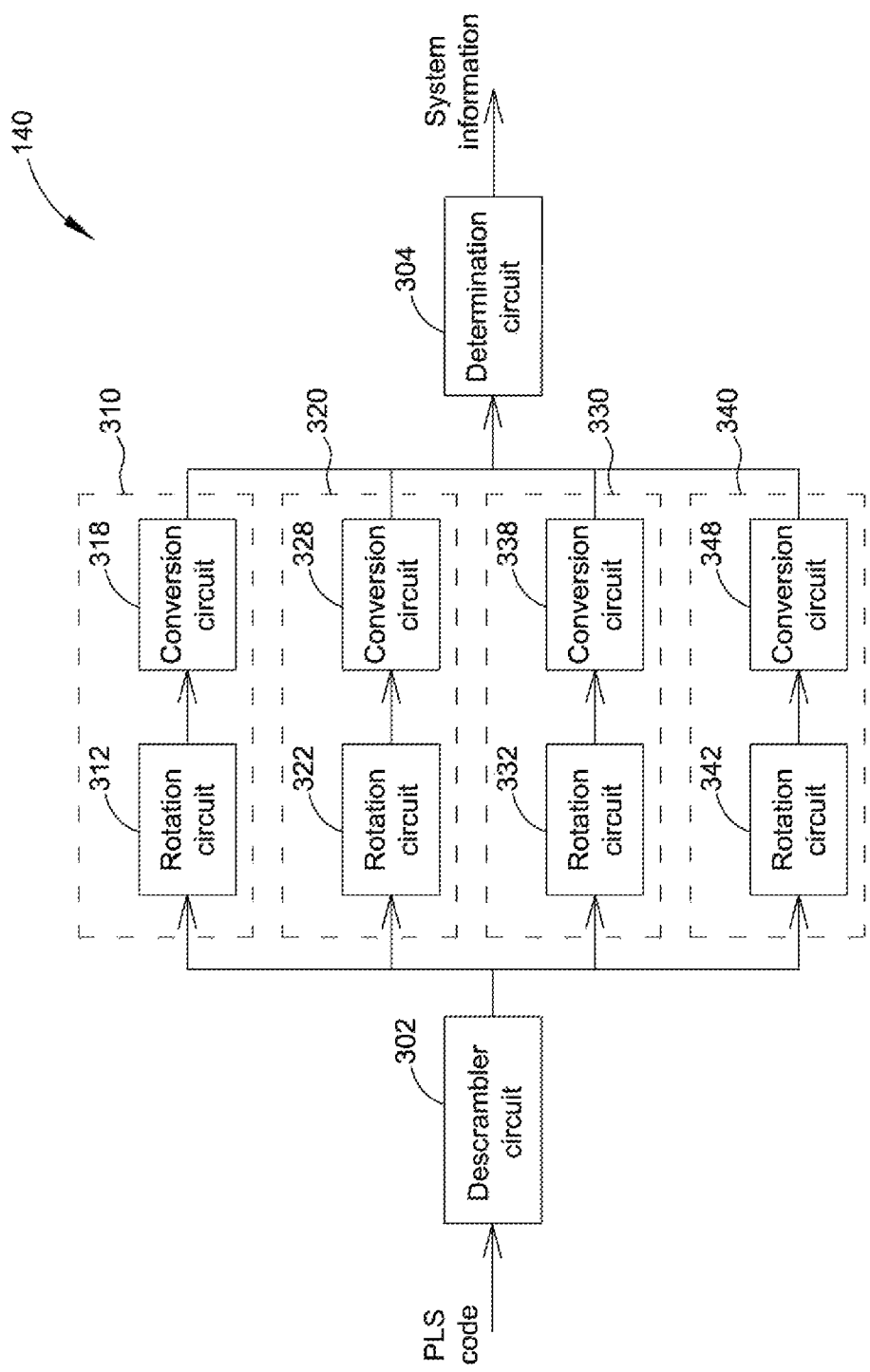
FIG. 3 is a block diagram of a decoding circuit according to an embodiment of the present invention.

FIG. 3 shows a block diagram of the decoding circuit 140 according to an embodiment of the present invention. As shown in FIG. 3, the decoding circuit 140 includes a descrambler circuit 302, four processing circuits 310, 320, 330 and 340, and a determination circuit 304. The processing circuit 304 includes a rotation circuit 312 and a conversion circuit 318, the processing circuit 320 includes a rotation circuit 322 and a conversion circuit 328, the processing circuit 330 includes a rotation circuit 332 and a conversion circuit 338, and the processing circuit 340 includes a rotation circuit 342 and a conversion circuit 348. In this embodiment, the descrambler circuit 302 descrambles the PLS code to generate a descrambled PLS code. The four processing circuits 310, 320, 330 and 340 individually process the descrambled PLS code by different calculation methods to generate first, second, third and fourth processed signals, respectively. The four processing circuits 310, 320, 330 and 340 respectively correspond to four combinations of a part (the 1$^{st}$ bit b0 and the 8$^{th}$ bit) of the system information, and the processed signals are for reflecting the bit combinations of the part of the system information. More specifically, the processing circuits 310, 320, 330 and 340 respectively correspond to a part of the system information including bit combinations (b0=0, b7=0), (b0=0, b7=1), (b0=1, b7=1) and (b0=1, b7=0). When the part of the system information corresponding to the PLS code includes the combination (b0=0, b7=0), the first processed signal generated by the processing circuit 310 then has a distinguishing property (e.g., a particularly large value) compared to other processed signals. Similarly, with respect to the descrambled PLS code corresponding to the part of the system information having bit combinations (b0=0, b7=1), (b0=1, b7=1) and (b0=1, b7=0), the processing circuits 320, 330 and 340 can generate second, third and fourth processed signals individually having a distinguishing property compared to other processed signals. Next, the determination circuit 304 determines the values of the 1$^{st}$ bit b0 and the 8$^{th}$ bit b7 according to the first, second, third and fourth processed signals outputted by the processing circuits 310, 320, 330 and 340, and accordingly determines the other bits b1 to b6 according to the determination result. Operation details of each circuit element in the processing circuits 310, 320, 330 and 340 and the determination circuit 304 are given below.

Figure 4:
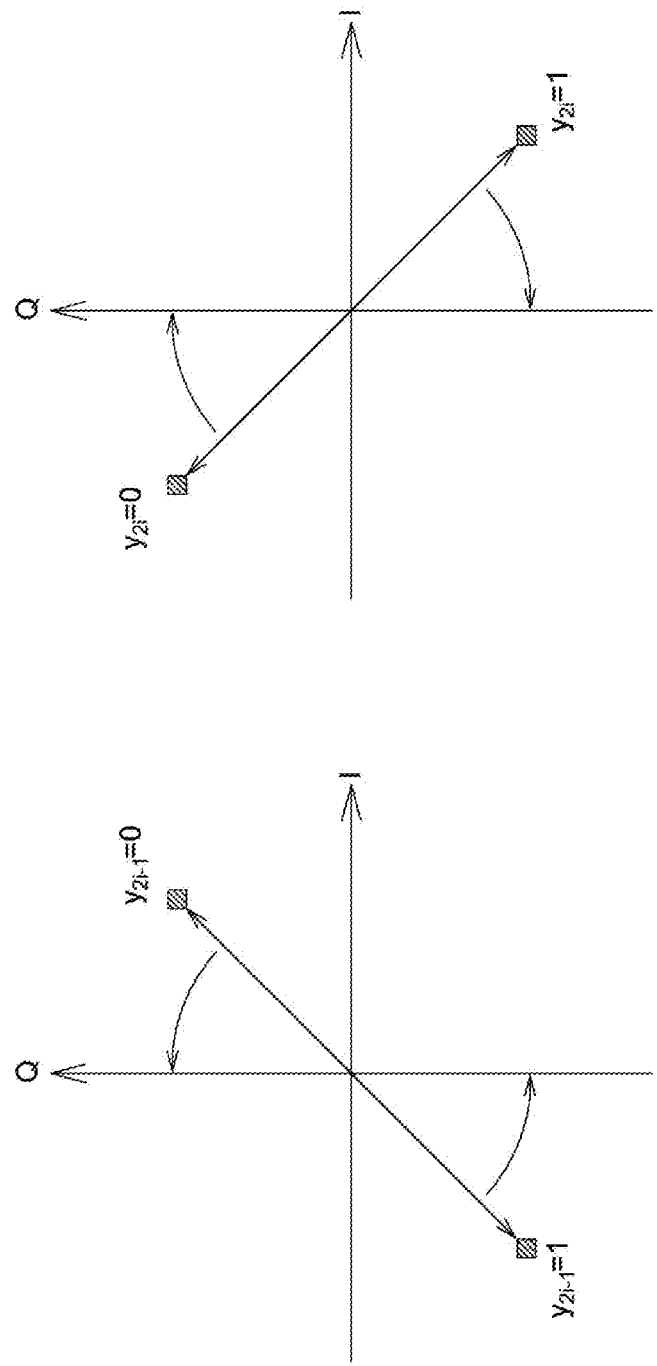
FIG. 4 is a schematic diagram of rotation circuits 312 and 322 performing phase rotation.

Take the rotation circuit 312 among the rotation circuits 312, 322, 332 and 342 for example. The rotation circuit 312 performs phase rotation on each bit value of the descrambled PLS code (64-bit) to map to an axis (an imaginary axis of complex coordinates in this embodiment) to further generate first rotated encoded data. Values of the first rotated encoded data corresponding to adjacent odd-number point and even-number point are added (e.g., the values of the first rotated encoded data corresponding to the 1$^{st}$ bit value and the 2$^{nd}$ bit value are added, the values of the first rotated encoded data corresponding to the 3$^{rd}$ bit value and the 4$^{th}$ bit value are added, and so forth; in this embodiment, the values of the first rotated encoded data refer to values on the imaginary axis of complex coordinates) to obtain first information (a 1*32 matrix). The method that the rotation circuit 312 uses for phase rotation is associated with the DVB-S2 specifications. The rotation circuit 322, similar to the rotation circuit 312, generates second rotated encoded data according to each bit value of the descrambled PLS code, and subtracts the values of the second rotated encoded data corresponding to adjacent odd-number point and even-number point from each other to obtain second information (a 1*32 matrix). FIG. 4 shows a schematic diagram of the rotation circuits 312 and 322 performing phase rotation. In FIG. 4, "i" represents the i$^{th}$ bit, i.e., "i" may be 1 to 32, $y_{2i-1}$ represents the bit value of an odd-number point of the descrambled PLS code, $y_{2i}$ represents the bit value of an odd-number point of the descrambled PLS code, and "Q" represents the imaginary axis. When the bit value of an odd-number point of the descrambled PLS code is "0", the rotation circuits 312 and 322 rotate the odd-number point by ($\pi/4$) to obtain a value "+1"; when the bit value of an odd-number point of the descrambled PLS code is "1", the rotation circuits 312 and 322 rotate the odd-number point by ($\pi/4$) to obtain a value "−1"; when the bit value of an even-number point of the descrambled PLS code is "0", the rotation circuits 312 and 322 rotate the even-number point by ($-\pi/4$) to obtain a value "+1"; and when the bit value of an even-number point of the descrambled PLS code is "1", the rotation circuits 312 and 322 rotate the even-number point by (−π/4) to obtain a value "−1".

Figure 5:
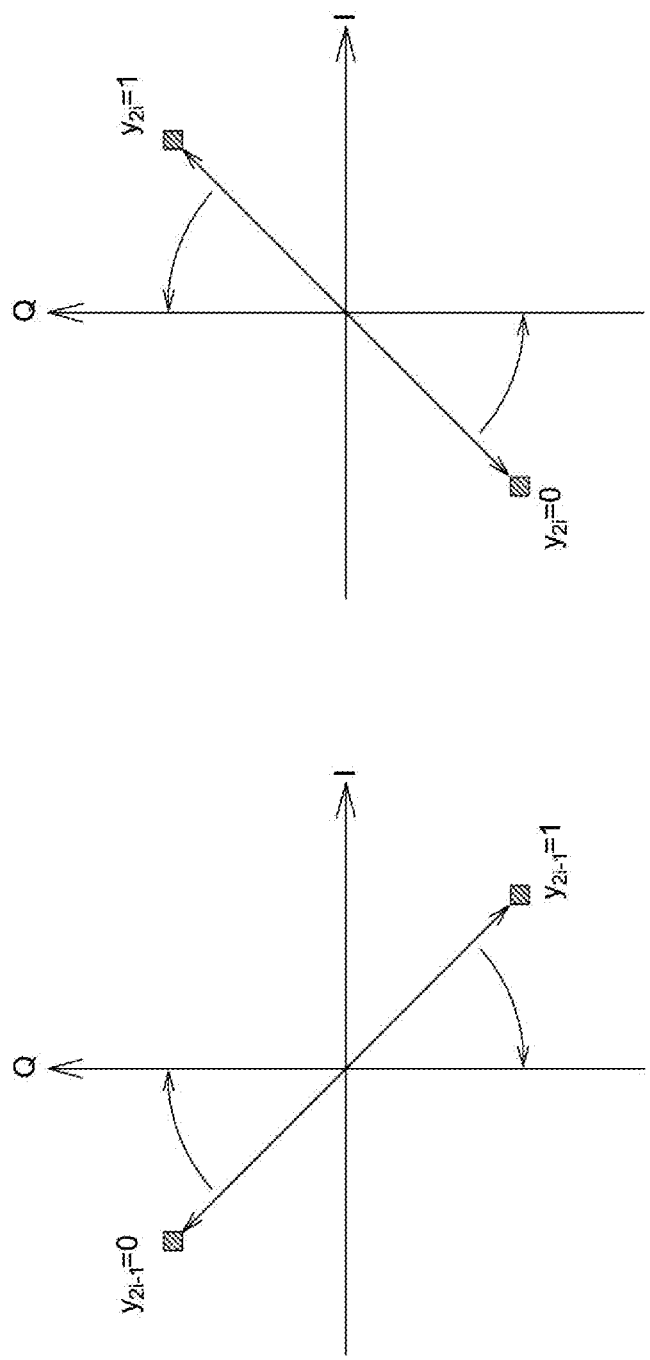
FIG. 5 is a schematic diagram of rotation circuits 332 and 342 performing phase rotation.

The rotation circuit 332, similar to the rotation circuit 312, generates third rotated encoded data according to each bit of the descrambled PLS code, and adds the values of the third rotated encoded data corresponding to adjacent odd-number point and even-number point to obtain third information (a 1*32 matrix). One difference of the rotation circuit 332 from the rotation circuit 312 is that, the method that the rotation circuit 332 uses for phase rotation is associated with the specifications of a DVB-S2X system. The rotation circuit 342, similar to the rotation circuit 332, generates fourth rotated encoded data according to each bit value of the descrambled PSS code, and subtracts values of the fourth rotated encoded data corresponding to adjacent odd-number point and even-number point from each other to obtain fourth information (a 1*32 matrix). One difference of the rotation circuit 342 from the rotation circuit 322 is that, the phase rotation method used by the rotation circuit 342 is performed according to the DVB-S2X specifications. FIG. 5 shows a schematic diagram of the rotation circuits 332 and 342 performing phase rotation. When the bit value of an odd-number point of the descrambled PLS code is "0", the rotation circuits 332 and 342 rotate the odd-number point by (−π/4) to obtain a value "+1"; when the bit value of an odd-number point of the descrambled PLS code is "1", the rotation circuits 332 and 342 rotate the odd-number point by (−π/4) to obtain a value "−1"; when the bit value of an even-number point of the descrambled PLS code is "0", the rotation circuits 332 and 342 rotate the even-number point by (π/4) to obtain a value "−1"; and when the bit value of an even-number point of the descrambled PLS code is "1", the rotation circuits 332 and 342 rotate the even-number point by (π/4) to obtain a value "+1".

Each value in the first information generated by the rotation circuit 312 can be represented as:

$$r_{soft\_add,\ S2,i} = \text{imag}(y_{2i-1}e^{j\pi/4}) + \text{imag}(y_{2i}e^{-j\pi/4});$$

each value in the second information generated by the rotation circuit 322 can be represented as:

$$r_{soft\_sub,\ S2,i} = \text{imag}(y_{2i-1}e^{j\pi/4}) - \text{imag}(y_{2i}e^{-j\pi/4});$$

each value in the third information generated by the rotation circuit 332 can be represented as:

$$r_{soft\_sub,\ S2X,i} = \text{imag}(y_{2i-1}e^{-j\pi/4}) + \text{imag}(y_{2i}e^{j\pi/4});$$

each value in the fourth information generated by the rotation circuit 342 can be represented as:

$$r_{soft\_sub,S2X,i} = \text{imag}(y_{2i-1}e^{-j\pi/4}) - \text{imag}(y_{2i}e^{j\pi/4}).$$

Figure 6:
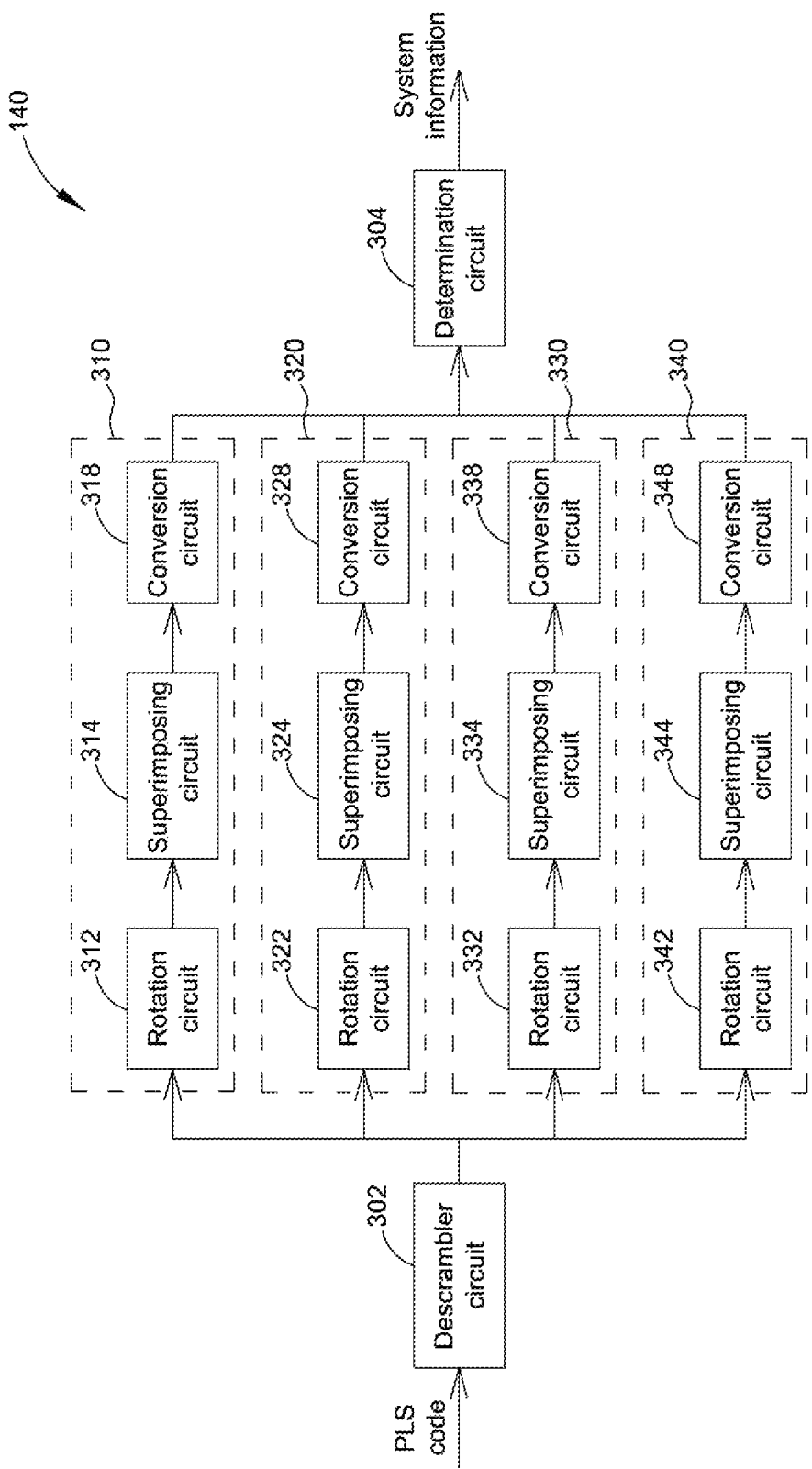
FIG. 6 is a block diagram of a decoding circuit according to another embodiment of the present invention.
Figure 7:
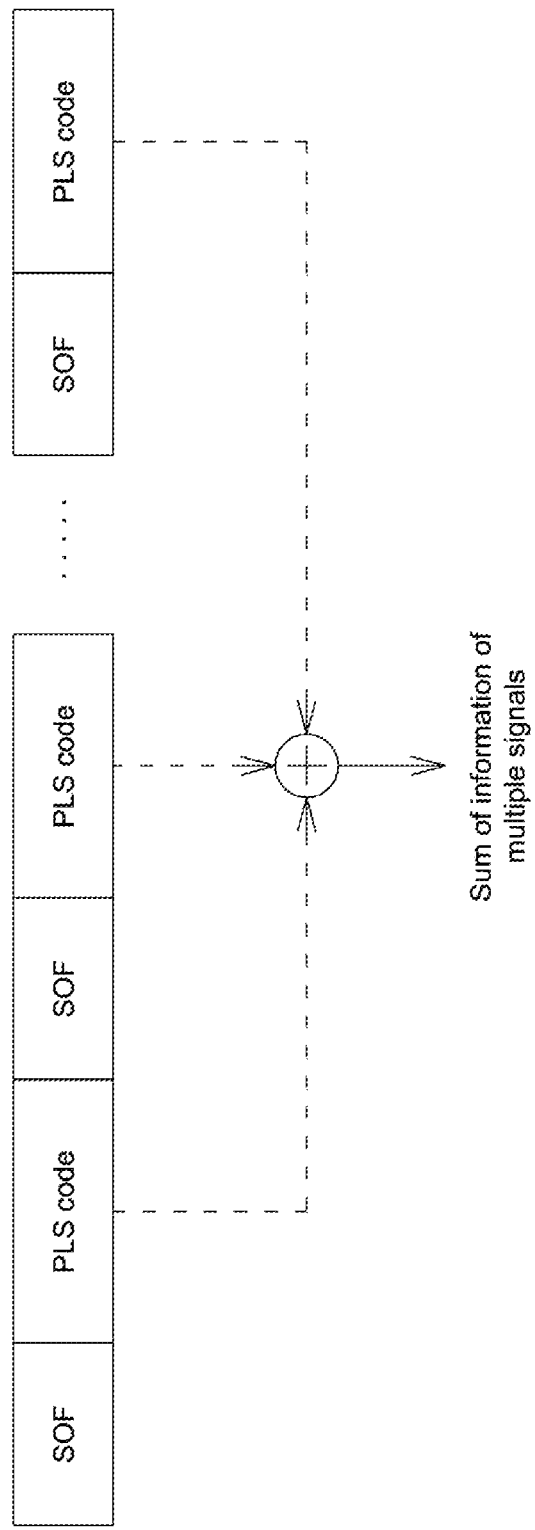
FIG. 7 is a schematic diagram of an operation of a superimposing circuit.

As previously described, for the part of the information of any bit combination, one of the first to fourth information has a distinguishing property (e.g., a particularly large value), and is in fact sufficient for the determination circuit 304 to determine the bit combination of the part of the information. FIG. 6 shows a block diagram of the decoding circuit 140 according to another embodiment of the present invention. In FIG. 6, the processing circuits 310, 320, 330 and 340 further include superimposing circuits 314, 324, 334 and 344, respectively. Refer to FIG. 7 for operation details of the superimposing circuits 314, 324, 334 and 344. The superimposing circuit 314 superimposes multiple sets of first information corresponding to different signal frames to generate first superimposed data. Similarly, the superimposing circuits 324, 334 and 344 respectively superimpose multiple sets of second, third and fourth information to generate second superimposed data, third superimposed data and fourth superimposed data. Because the superimposed data further reinforces the distinguishing properties from one another, the determination made accordingly for the part of the information is more accurately.

The conversion circuits 318, 328, 338 and 348 decode the PLS code in the first to fourth information or the PLS code in the first to fourth superimposed data through a matrix. It should be noted that, not all values in the 1$^{st}$ column of the generation matrix that the transmitting end of the DVB-S2X system uses for generating the PLS code signal are 0, and thus the conversion circuit 338 and 348 each further includes a mapping circuit (not shown) to remove the effect that the 1$^{st}$ column of the generation matrix causes on the PLS code signal. In other words, the mapping circuits included in the conversion circuits 338 and 348 respectively modify a part of the contents of the third superimposed data and the fourth superimposed data to remove the effect of the 1$^{st}$ column of the generation matrix. In this embodiment, the mapping circuits 336 and 346 converts positive/negative signs of the 0$^{th}$, 3$^{rd}$, 8$^{th}$, 10$^{th}$, 12$^{th}$, 13$^{th}$, 18$^{th}$, 20$^{th}$, 21$^{st}$, 23$^{rd}$, 24$^{th}$, 25$^{th}$, 27$^{th}$, 28$^{th}$, 29$^{th}$, and 31$^{st}$ bits to remove the effect of the 1$^{st}$ column. In contrast, as a DVB-S2 system does not have the above issue, no additional mapping circuits are needed to process the first superimposed data and the second superimposed data.

The conversion circuits 318, 328, 338 and 348 perform data conversion on the first, second, third and fourth superimposed data (wherein the third and fourth superimposed data have been processed by the mapping circuits), respectively, to generate first, second, third and fourth processed signals. In this embodiment, the conversion circuits 318, 328, 338 and 348 multiply the first, second, third and fourth superimposed data by a 32*32 Hadamard matrix, respectively, to generate the first, second, third and fourth processed signals. The operation of the conversion circuit 318 can be represented as:

$$A_{soft\_add,S\ 2} = r_{soft\_add,S\ 2}H_{32*32}$$

$$r_{soft\_add,\ S2} = [r_{soft\_add\ .S2,1} \cdots r_{soft\_add,\ S2,31}],$$

where $A_{soft\_add,S\ 2}$ is the first processed signal, $r_{soft\_add,\ S2}$ is for representing the first superimposed signal, and $H_{32*32}$ is the Hadamard matrix;
the operation of the conversion circuit 328 can be represented as:

$$A_{soft\_sub,S\ 2} = r_{soft\_add,S\ 2}H_{32*32}$$

$$r_{soft\_sub,\ S2} = [r_{soft\_sub\ .S2,1} \cdots r_{soft\_sub,\ S2,31}],$$

where $A_{soft\_sub,\ S2}$ is the second processed signal, and $r_{soft\_sub,\ S2}$ is for representing the second superimposed data;
the operation of the conversion circuit 338 can be represented as:

$$A_{soft\_add,\ S2X} = r_{soft\_add,\ S2X}H_{32*32}$$

$$r_{soft\_add,S\ 2X} = [r_{soft\_add\ .S2X,1} \cdots r_{soft\_add,S\ 2,31}],$$

where $A_{soft\_add,\ S2X}$ is the third processed signal, and $r_{soft\_add,\ S2X}$ for representing the third superimposed signal having been processed by the mapping circuit; and
the operation of the conversion circuit 348 can be represented as:

$$A_{soft\_sub,\ S2X} = r_{soft\_add,\ S2X}H_{32*32}$$

$$r_{soft\_sub,S\ 2X} = [r_{soft\_sub\ .S2X,1} \cdots r_{soft\_sub,S\ 2X,\ 31}],$$

where $A_{soft\_sub,\ S2X}$ is the fourth processed signal, and $r_{soft\_sub,\ S2X}$ is for representing the fourth superimposed signal having been processed by the mapping circuit.

The determination circuit 304 determines the values of the bits b0 and b7 in the system information according to the first, second, third and fourth processed signals, and accordingly determines the values of other bits b1 to b6. More specifically, the determination circuit 304 first determines, of the first, second, third and fourth processed signals, an argument having a largest value, as follows:

$a_0 = \arg\max |A_{soft\_add,S\ 2}|, A_{soft\_add\_S\ 2} = \{A_{0,0}, A_{0,1}, \ldots A_{0,31}\};$ $a_1 = \arg\max |A_{soft\_sub,\ S2}|, A_{soft\_sub\_S\ 2} = \{A_{1,0}, A_{1,1}, \ldots A_{1,31}\};$ $a_2 = \arg\max |A_{soft\_add,S\ 2X}|, A_{soft\_add\_S\ 2X} = \{A_{2,0}, A_{2,1}, \ldots A_{2,31}\};$ and $a_3 = \arg\max |A_{soft\_sub,\ S2}|, A_{soft\_sub\_S\ 2} = \{A_{3,0}, A_{3,1}, \ldots A_{3,31}\}.$ The determination circuit 304 compares the values of a0, a1, a2 and a3 to determine the values of b0 and b7 in the system information. That is, when the value of a0 is the largest, b0=0 and b7=0; when the value of a1 is the largest, b0=0 and b7=1; when the value of a2 is the largest, b0=1 and b7=1; and when the value of a3 is the largest, b0=1 and b7=0.

It is then assumed that the largest value among of a1, a2, a3 and a4 is amax (an integer between 0 and 31), and the values of b1 to b5 can be obtained through representing amax by an binary expression; that is:

$a\ \max = (b_5 b_4 b_3 b_2 b_1),\ a \in \{0,31\}.$

According to the value of $A_{max\ index,amax}$) the value of b6 in the system information is determined. When the value of $A_{max\ index,amax}$ is greater than 0, b6 is 0; and when the value of $A_{max\_index,amax}$ is not greater than 1, b6 is 1. Wherein, max_index represents to which of a0, a1, a2 and a3 amax corresponds; that is, when amax is a0, max_index is "0", and when amax is a1, max_index is "1"; and so forth.

As described above, the bits b0 to b7 of the 8-bit system information can be accurately determined. The system information mainly includes information such as the modulation scheme, the code rate, a forward error correction data length, and whether pilot data is present, and may be transmitted to back-end circuits for phase compensation or elements of an equalizer.

It should be noted that, although a decoding circuit in a DVB-S2X is taken as an example in the above embodiments, the present invention is not limited to such example. In other embodiments of the present invention, given that a decoding circuit includes multiple processing circuit modules for simultaneously performing different calculations on encoded data, and the processed signal generated by each of the processing circuits is capable of reflecting a particular bit combination of a part of the system information, the present invention is applicable to various different decoding circuits. Further, in one embodiment, when a part of the system information is N-bit, the number of the processing circuit modules is the square of N. Further, in the present invention, although the determination circuit 304 determines the values of b0 and b7 according to the first, second, third and fourth processed signals, the determination circuit 304 in the decoding circuit 140 disclosed by the present invention can also perform the determination directly according to the first to fourth information, or one of the first to fourth superimposed data having a distinguishing property (e.g., a particularly large value). However, when the determination circuit 304 performs the determination according to the first to fourth processed signals, the values of b1 to b6 in the system information can be at the same time determined. Thus, the determination made on the basis of the first to fourth processed signals is more efficient.

Figure 8:
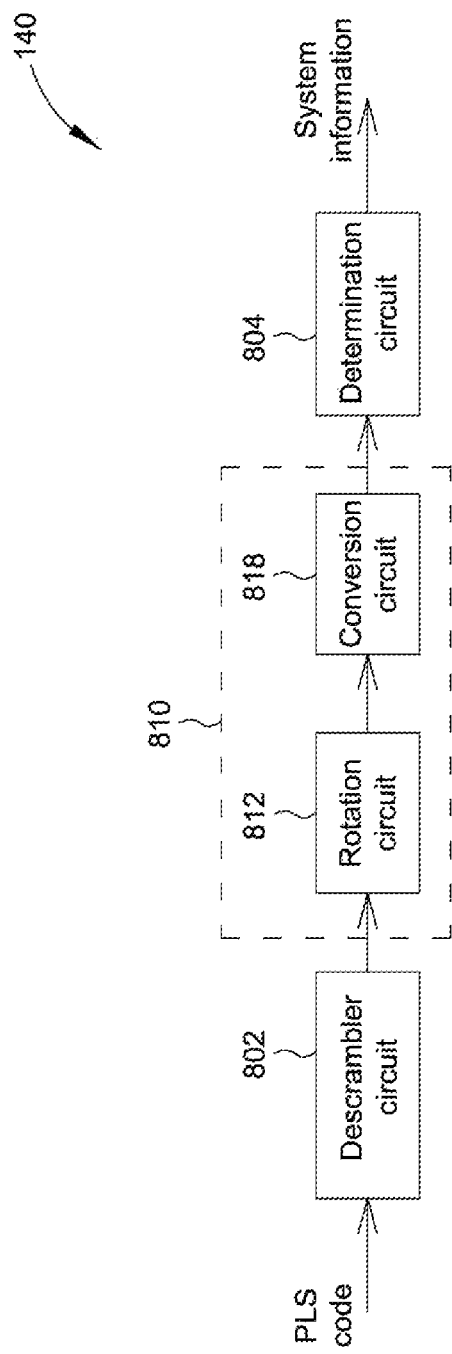
FIG. 8 is a block diagram of a decoding circuit according to another embodiment of the present invention.

FIG. 8 shows a block diagram of the decoding circuit 140 according to another embodiment of the present invention. As shown in FIG. 8, the decoding circuit 140 includes a descrambler circuit 802, a processing circuit 810 and a determination circuit 804. The processing circuit 810 includes a rotation circuit 812 and a conversion circuit 818. One difference between the embodiment in FIG. 8 from that in FIG. 3 is that, the embodiment in FIG. 3 adopts four different processing circuits 310 to 340 to parallel process the descrambled PLS code, and the embodiment in FIG. 8 processes the descrambled PLS code by adopting a time-division method. More specifically, at a first time point, the operation of the processing circuit 810 is identical to that of the processing circuit 310 so as to generate a first processed signal; at a second time point, the operation of the processing circuit 810 is identical to that of the processing circuit 320 so as to generate a second processed signal; at a third time point, the operation of the processing circuit 810 is identical to that of the processing circuit 330 so as to generate a third processed signal; and at a fourth time point, the operation of the processing circuit 810 is identical to that of the processing circuit 340 so as to generate a fourth processed signal. After having collected the first, second, third and fourth processed signals, the determination circuit 304 can determine the values of b0 and b7 in the system information, and accordingly determine other bits b1 to b6.

Figure 9:
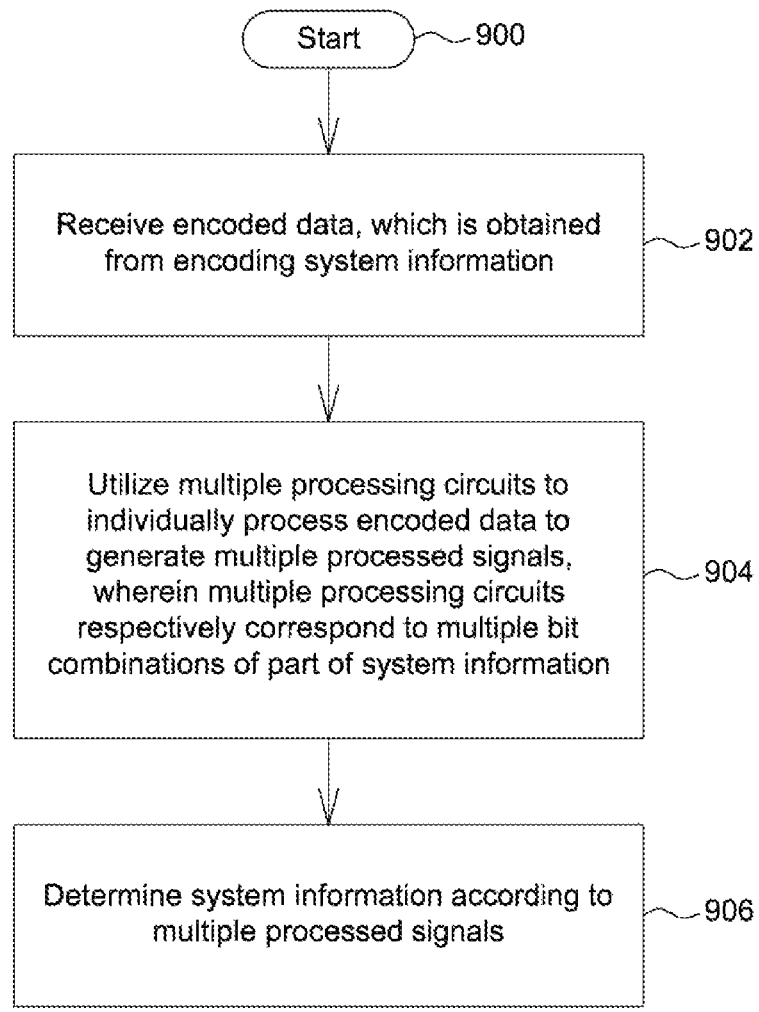
FIG. 9 is a flowchart of a decoding method according to an embodiment of the present invention applied to a multimedia apparatus.

FIG. 9 shows a flowchart of a process of a decoding method according to an embodiment of the present invention applied to a multimedia apparatus. Referring to FIG. 1 to FIG. 7 as well as the disclosure above, the decoding method includes following steps.

In step 900, the process begins.

In step 902, encoded data, generated from encoding system information, is received.

In step 904, the encoded data is processed individually by multiple processing circuits to generate multiple processed signals. The multiple processing circuits respectively corresponding to multiple bit combinations of a part of the system information.

In step 906, the system information is determined according to the multiple processed signals.

In summary, in the decoding circuit and the associated decoding method of the present invention, different operations are performed on the PLS code by multiple processing circuit modules to obtain multiple processed signals, wherein each of the processing circuit modules corresponds to one bit combination of a part of the system information corresponding to the PLS code, and the processed signal can reflect whether the PLS code corresponds to the bit combination. With the present invention, the PLS code can be accurately decoded by a one-time process to obtain the system information, eliminating the issue of the prior art that many attempts may be needed in order to provide successful decoding.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broad-

What is claimed is:

1. A decoding circuit, applied to a multimedia apparatus, for decoding encoded data to generate system information, the decoding circuit comprising:
   a plurality of processing circuits, individually processing the encoded data to generate a plurality of processed signals, the plurality of processing circuits respectively corresponding to a plurality of bit combinations of a part of the system information; and
   a determination circuit, coupled to the plurality of processing circuits, determining the system information according to the plurality of processed signals;
   wherein the multimedia apparatus is compliant with a Digital Video Broadcasting (DVB) system, and the encoded data is a physical layer signaling (PLS) code; and
   wherein the part of the system information comprises a first bit and a second bit, the first bit is for indicating that the encoded data is compliant with one of a Digital Video Broadcasting-Satellite Second Generation (DVB-S2) system and a Digital Video Broadcasting-Satellite Second Generation Extension (DVB-S2X) system, and the second bit is for indicating whether the encoded data includes pilot data.

2. The decoding circuit according to claim 1, wherein the part of the system information comprises N bits, and a quantity of the plurality of processing circuits is a square of N.

3. The decoding circuit according to claim 1, wherein one of the plurality of processing circuits is for processing the encoded data to generate one of the plurality of processed signals; when the first bit indicates the DVB-S2X system and the second bit indicates that the encoded data includes the pilot data, the one of the plurality of processed signals has a distinguishing property compared to the remaining of the processed signals.

4. The decoding circuit according to claim 3, wherein the one of the plurality of processing circuits comprises:
   a rotation circuit, performing phase rotation on each bit value in the encoded data to map to an axis to generate a plurality of set of rotated encoded data, and adding two sets of the rotated encoded data generated according to adjacent bit values to obtain a set of information; and
   a conversion circuit, performing data conversion according to the set of information to generate the one of the plurality of processed signals.

5. The decoding circuit according to claim 4, wherein one other of the plurality of processing circuits comprises:
   a superimposing circuit, superimposing a plurality of sets of information corresponding to different signal frames to generate superimposed data;
   wherein, the conversion circuit performs the data conversion according to the superimposed data to generate the one of the plurality of processed signals.

6. The decoding circuit according to claim 4, wherein the encoded data is generated from multiplying the system information by a generation matrix, and the one other of the plurality of processing circuits comprises:
   a mapping circuit, mapping the set of information to remove an effect of a specific content in the generation matrix.

7. The decoding circuit according to claim 1, wherein the determination circuit determines an argument having a largest value from the plurality of processed signals, and obtains a part of bit values of the system information through a binary expression of the argument having the largest value.

8. The decoding circuit according to claim 7, wherein the determination circuit further determines a corresponding value of the processed signal according to the argument having the largest value, and determines one other bit value of the system information according to whether the corresponding value is greater than zero.

9. A decoding method, applied to a multimedia apparatus, for decoding encoded data to generate system information, the decoding method comprising:
   utilizing a plurality of processing circuits to individually process the encoded data to generate a plurality of processed signals, wherein the plurality of processing circuits respectively correspond to a plurality of bit combinations of a part of the system information; and
   determining the system information according to the plurality of processed signals;
   wherein the multimedia apparatus is compliant with a Digital Video Broadcasting (DVB) system, and the encoded data is a physical layer signaling (PLS) code; the part of the system information comprises a first bit and a second bit, the first bit is for indicating that the encoded data is compliant with one of a Digital Video Broadcasting-Satellite Second Generation(DVB-S2) system and a Digital Video Broadcasting-Satellite Second Generation Extension (DVB-S2X) system, and the second bit is for indicating whether the encoded data includes pilot data.

10. The decoding method according to claim 9, wherein the part of the system information comprises N bits, and a quantity of the plurality of processing circuits is a square of N.

11. The decoding method according to claim 9, wherein one of the plurality of processing circuits is for processing the encoded data to generate one of the plurality of processed signals; when the first bit indicates the DVB-S2X system and the second bit indicates that the encoded data includes the pilot data, the one of the plurality of processed signals has a distinguishing property compared to the remaining of the processed signals.

12. The decoding method according to claim 11, wherein the step of processing the encoded data to generate the one of the plurality of processed signals comprises:
   performing phase rotation on each bit value in the encoded data to map to an axis to generate a plurality of set of rotated encoded data, and adding two sets of the rotated encoded data generated according to adjacent bit values to obtain a set of information; and
   performing data conversion according to the set of information to generate the one of the plurality of processed signals.

13. The decoding method according to claim 12, wherein the step of processing the encoded data to generate the one of the plurality of processed signals further comprises:
   superimposing a plurality of sets of information corresponding to different signal frames to generate superimposed data; and
   the step of performing the data conversion according to the set of information to generate the one of the plurality of processed signals comprises:
   performing the data conversion according to the superimposed data to generate the one of the plurality of processed signals.

14. The decoding method according to claim 12, wherein the encoded data is generated from multiplying the system information by a generation matrix, and the step of processing the encoded data to generate the one of the plurality of processed data further comprises:

mapping the set of information to remove an effect of a specific content in the generation matrix.

15. The decoding method according to claim 9, wherein the step of determining the system information according to the plurality of processed signals comprises:

determining an argument having a largest value from the plurality of processed signals, and obtaining a part of bit values of the system information through a binary expression of the argument having the largest value.

16. The decoding method according to claim 15, wherein the step of determining the system information according to the plurality of processed signals further comprises:

determining a corresponding value of the processed signal according to the argument having the largest value, and determining one other bit value of the system information according to whether the corresponding value is greater than zero.

17. A decoding circuit, applied to a multimedia apparatus, for decoding an encoded data to generate system information, the decoding circuit comprising:

a processing circuit, processing the encoded data to generate a plurality of processed data, which respectively correspond to a plurality of bit combinations of a part of the system information; and a determination circuit, coupled to the processing circuit, determining that the part of the system information corresponds to one of the plurality of bit combinations according to the plurality of processed signals;

wherein the multimedia apparatus is compliant with a Digital Video Broadcasting (DVB) system, and the encoded data is a physical layer signaling (PLS) code; and wherein the part of the system information comprises a first bit and a second bit, the first bit is for indicating that the encoded data is compliant with one of a Digital Video Broadcasting-Satellite Second Generation (DVB-S2) system and a Digital Video Broadcasting-Satellite Second Generation Extension (DVB-S2X) system, and the second bit is for indicating whether the encoded data includes pilot data.

* * * * *